US006168903B1

(12) United States Patent
Cassidy et al.

(10) Patent No.: US 6,168,903 B1
(45) Date of Patent: Jan. 2, 2001

(54) LITHOGRAPHIC IMAGING WITH REDUCED POWER REQUIREMENTS

(75) Inventors: Kenneth R. Cassidy, Chelmsford, MA (US); Thomas E. Lewis, East Hampstead, NH (US); Richard J. D'Amato, South Hadley, MA (US)

(73) Assignee: Presstek, Inc., Hudson, NH (US)

( * ) Notice: Under 35 U.S.C. 154(b), the term of this patent shall be extended for 0 days.

(21) Appl. No.: 09/245,103

(22) Filed: Jan. 21, 1999

(51) Int. Cl.$^{7}$ .................... G03F 7/11; B41N 1/08

(52) U.S. Cl. .................... 430/302; 430/273.1; 430/272.1; 101/467

(58) Field of Search .................... 430/271.1, 272.1, 430/273.1, 302; 101/467

(56) References Cited

U.S. PATENT DOCUMENTS

| | | | |
|---|---|---|---|
| 3,945,318 | 3/1976 | Landsman | 101/467 |
| 3,964,389 | 6/1976 | Peterson | 101/467 |
| 4,588,674 | 5/1986 | Stewart et al. | 430/273 |
| 4,711,834 | 12/1987 | Butters et al. | 430/201 |
| 5,156,938 | 10/1992 | Foley et al. | 430/200 |
| 5,171,650 | 12/1992 | Ellis et al. | 430/20 |
| 5,238,778 | 8/1993 | Hirai et al. | 430/200 |
| 5,308,737 | 5/1994 | Bills et al. | 430/201 |
| 5,339,737 * | 8/1994 | Lewis et al. | 101/454 |
| 5,353,705 * | 10/1994 | Lewis et al. | 101/453 |
| 5,395,729 | 3/1995 | Reardon et al. | 430/200 |
| 5,460,918 | 10/1995 | Ali et al. | 430/200 |
| 5,506,085 | 4/1996 | Van Damme et al. | 430/200 |
| 5,704,291 * | 1/1998 | Lewis | 101/457 |
| 5,756,689 * | 5/1998 | Busman et al. | 534/560 |
| 5,783,364 * | 7/1998 | Ellis et al. | 430/302 |
| 5,786,129 * | 7/1998 | Ellis | 430/302 |
| 5,819,661 | 10/1998 | Lewis et al. | 101/467 |
| 5,822,345 * | 10/1998 | Sousa et al. | 372/38 |

FOREIGN PATENT DOCUMENTS

| | | | |
|---|---|---|---|
| 2020836 | 11/1979 | (GB) . | |
| 2176018A | 12/1986 | (GB) | B41M 5/26 |

* cited by examiner

*Primary Examiner*—Janet Baxter
*Assistant Examiner*—Barbara Gilliam
(74) *Attorney, Agent, or Firm*—Testa, Hurwitz & Thibeault LLP

(57) ABSTRACT

Imaging of lithographic printing plates with reduced fluence requirements is accomplished using printing members that have a solid substrate, gas-producing and radiation-absorptive layers over the substrate, and a topmost layer that contrasts with the substrate in terms of lithographic affinity. Exposure of the radiation-absorptive layer to laser light causes this layer to become intensely hot. This, in turn, activates the gas-producing layer, causing rapid evolution and expansion of gaseous decomposition products. The gases stretch the overlying topmost layer to create a bubble over the exposure region, where the imaging layers have been destroyed. If this process is sufficiently explosive, the neck of the bubble expands beyond the diameter of the incident laser beam, tearing the topmost layer and the underlying imaging layers away from the substrate outside the exposed region. The entire affected area is easily removed during a post-imaging cleaning process, resulting in an image spot larger than the incident beam diameter.

29 Claims, 2 Drawing Sheets

LITHOGRAPHIC IMAGING WITH REDUCED POWER REQUIREMENTS

BACKGROUND OF THE INVENTION

1. Field of the Invention

The present invention relates to digital printing methods and materials, and more particularly to imaging of lithographic printing-plate constructions on- or off-press using digitally controlled laser output.

2. Description of the Related Art

In offset lithography, a printable image is present on a printing member as a pattern of ink-accepting (oleophilic) and ink-rejecting (oleophobic) surface areas. Once applied to these areas, ink can be efficiently transferred to a recording medium in the imagewise pattern with substantial fidelity. Dry printing systems utilize printing members whose ink-repellent portions are sufficiently phobic to ink as to permit its direct application. Ink applied uniformly to the printing member is transferred to the recording medium only in the imagewise pattern. Ordinarily, the printing member first makes contact with a compliant intermediate surface called a blanket cylinder which, in turn, applies the image to the paper or other recording medium. In typical sheet-fed press systems, the recording medium is pinned to an impression cylinder, which brings it into contact with the blanket cylinder.

In a wet lithographic system, the non-image areas are hydrophilic, and the necessary ink-repellency is provided by an initial application of a dampening (or "fountain") solution to the plate prior to inking. The fountain solution prevents ink from adhering to the non-image areas, but does not affect the oleophilic character of the image areas.

Traditional platemaking processes tend to be time-consuming and require facilities and equipment adequate to support the necessary chemistry. To circumvent these shortcomings, practitioners have developed a number of electronic alternatives to plate imaging. With these systems, digitally controlled devices alter the ink-receptivity of blank plates in a pattern representative of the image to be printed. U.S. Pat. Nos. 5,339,737, 5,783,364, and 5,807,658, the entire disclosures of which are hereby incorporated by reference, disclose a variety of lithographic plate configurations for use with imaging apparatus that operate by laser discharge. These include wet plates as described above and dry plates to which ink is applied directly. The plates may be imaged on a stand-alone platemaker or directly on-press.

Laser-imageable materials may be imaged by pulses of near-infrared (near-IR) light from inexpensive solid-state lasers. Such materials typically exhibit a nonlinear response to near-IR exposure, namely, a relatively sharp imaging-fluence threshold for short-duration laser pulses but essentially no response to ambient light. A longstanding goal of plate designers is to reduce the threshold laser fluence necessary to produce an imaging response while maintaining desirable properties such as durability, manufacturability, and internal compatibility.

One strategy frequently proposed in connection with photothermal materials is incorporation of energetic (e.g., self-oxidizing) compositions, which, in effect, contribute chemical energy to the imaging process. For example, the '737 patent mentioned above discloses nitrocellulose layers that undergo energetic chemical decomposition in response to heating. Unfortunately, these materials have not been shown to reduce the fluence thresholds necessary for imaging. Instead, they are either employed as essentially interchangeable alternatives to non-energetic materials, or as propellant layers in transfer-type materials (see, e.g., U.S. Pat. Nos. 5,308,737, 5,278,023, 5,156,938, and 5,171,650).

DESCRIPTION OF THE INVENTION

Brief Summary of the Invention

It has been found, surprisingly, that the combination of a thermally activated gas-forming composition with a material that strongly absorbs imaging radiation, used as co-active imaging layers in a laser-imageable construction, results in substantial enlargement of the area affected by a laser pulse (as compared with constructions utilizing as imaging layers either component alone). The result is considerable reduction in the fluence necessary to create an image spot of a given size.

A printing member in accordance with the present invention includes a solid substrate, gas-producing and radiation-absorptive layers over the substrate, and a topmost layer that contrasts with the substrate in terms of lithographic affinity. The order in which the gas-producing and radiation-absorptive layers appear depends on the mode of imaging—that is, whether laser radiation is applied through the topmost layer or through the substrate. In operation, exposure of the radiation-absorptive layer to laser light causes this layer to become intensely hot. This, in turn, activates the gas-producing layer, causing rapid evolution and expansion of gaseous decomposition products. The gases stretch the overlying topmost layer to create a bubble over the exposure region, where the imaging layers have been destroyed. If this process is sufficiently explosive, the neck of the bubble expands beyond the diameter of the incident laser beam, tearing the topmost layer and the underlying imaging layers away from the substrate outside the exposed region. The entire affected area is easily removed during a post-imaging cleaning process, resulting in an image spot larger than the incident beam diameter. Furthermore, because the decomposition gases are retained within the bubble, there is no danger of environmental contamination.

Post-imaging cleaning can be accomplished either manually (by dry rubbing or rubbing with a cleaning liquid, as described in U.S. Pat. No. 5,540,150) or using a contact cleaning device (e.g., a rotating brush as described in U.S. Pat. No. 5,148,746) or other suitable means (e.g., as set forth in U.S. Pat. No. 5,755,158).

It should be stressed that, as used herein, the term "plate" or "member" refers to any type of printing member or surface capable of recording an image defined by regions exhibiting differential affinities for ink and/or dampening fluid; suitable configurations include the traditional planar or curved lithographic plates that are mounted on the plate cylinder of a printing press, but can also include seamless cylinders (e.g., the roll surface of a plate cylinder), an endless belt, or other arrangement.

Furthermore, the term "hydrophilic" is herein used in the printing sense to connote a surface affinity for a fluid which prevents ink from adhering thereto. Such fluids include water, aqueous and non-aqueous dampening liquids, the non-ink phase of single-fluid ink systems. Thus, a hydrophilic surface in accordance herewith exhibits preferential affinity for any of these materials relative to oil-based materials.

BRIEF DESCRIPTION OF THE DRAWINGS

The foregoing discussion will be understood more readily from the following detailed description of the invention, when taken in conjunction with the accompanying drawings, in which.

DETAILED DESCRIPTION OF THE PREFERRED EMBODIMENTS

Figure 1:
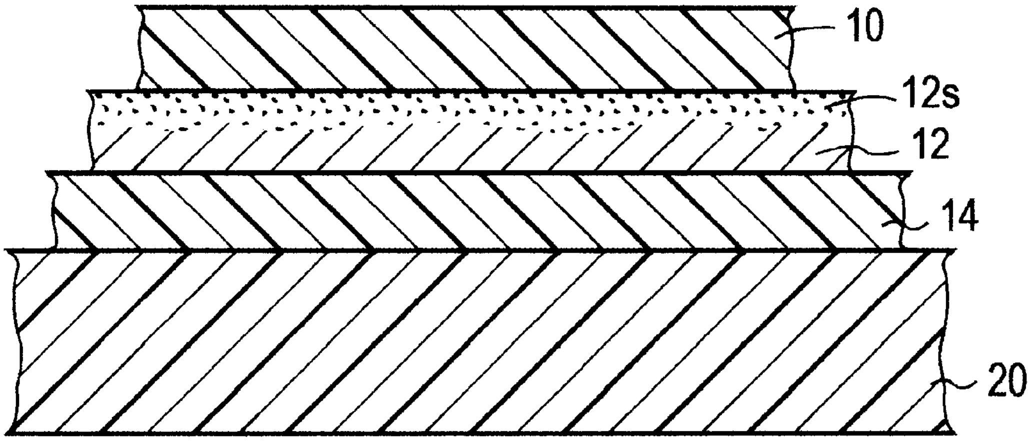
FIG. 1 is an enlarged sectional view of a lithographic plate imageable in accordance with the present invention.

With reference to FIG. 1, a representative embodiment of a printing plate in accordance with the invention includes a topmost layer 10, a radiation-absorptive layer 12, a gas-producing layer 14, and a substrate 20. Layers 10 and 20 exhibit opposite affinities for ink or fluid to which ink will not adhere, and generally, layer 10 will be polymeric. In one version of this plate, topmost layer 10 is a silicone polymer that repels ink, while substrate 20 is an oleophilic polyester or aluminum material; the result is a dry plate. In a second, wet-plate version, surface layer 10 is a hydrophilic material while substrate 20 is both oleophilic and hydrophobic.

Preferred silicone formulations are addition-cure polysiloxanes, such as those described in U.S. Pat. No. Re. 35,512, the entire disclosure of which is hereby incorporated by reference; suitable hydrophilic polymers include polyvinyl alcohol materials (e.g., the Airvol 125 material supplied by Air Products, Allentown, Pa.).

Substrate 20 is preferably strong, stable and flexible, and may be a polymer film, or a paper or metal sheet. Polyester films (in a preferred embodiment, the MYLAR or MELINEX films sold by E.I. duPont de Nemours Co., Wilmington, Del.) furnish useful examples. A preferred polyester-film thickness is 0.007 inch, but thinner and thicker versions can be used effectively. Paper substrates are typically "saturated" with polymerics to impart water resistance, dimensional stability and strength. Aluminum is a preferred metal substrate.

Depending on the thicknesses and optical densities of imaging layers 12, 14, the substrate (or a layer thereunder) may be reflective of imaging radiation so as to redirect it back into the imaging layers. For example, an aluminum substrate 20 may be polished to reflect imaging radiation. One can also employ, as an alternative to a metal reflective substrate 20, a layer containing a pigment that reflects imaging (e.g., IR) radiation. A material suitable for use as an IR-reflective substrate is the white 329 film supplied by ICI Films, Wilmington, Del., which utilizes IR-reflective barium sulfate as the white pigment. A preferred thickness is 0.007 inch, or 0.002 inch if the construction is laminated onto a metal support (as described, for example, in the '512 patent).

In accordance with copending application Ser. No. 09/122,261 (filed on Jul. 24, 1998 and entitled METHOD OF LITHOGRAPHIC IMAGING WITH REDUCED DEBRIS-GENERATED PERFORMANCE DEGRADATION AND RELATED CONSTRUCTIONS), the entire disclosure of which is hereby incorporated by reference, it is possible to add an insulating (e.g., polysilane) layer between topmost layer 10 and layers 12, 14 for purposes of debris management. For the same purpose, one may disperse a solid filler material such as particulate silica within topmost layer 10 in order to generate debris with hydrophilic sites, rendering them compatible with cleaning solutions.

Layer 12 may be a very thin (50–500 Å, with 250 Å preferred for titanium) layer of a metal that may or may not develop a native oxide surface 12*s* upon exposure to air. This layer ablates in response to IR radiation, undergoing catastrophic overheating and thereby igniting layer 14. Although the preferred material is titanium, other materials suitable for layer 12 include other d-block (transition) metals, aluminum, indium, tin, silicon, and bismuth, either singly or in combination. In the case of a mixture, the metals are present as an alloy or an intermetallic.

An alternative material, which may be used in conjunction with or in lieu of a metal layer 12 as described above, is a metallic inorganic layer comprising a compound of at least one metal with at least one non-metal, or a mixture of such compounds. Such a layer is generally applied at a thickness of 50–500 Å; optimal thickness is determined primarily the need for rapid heating to a very high temperature upon absorption of laser energy, but also by functional concerns—i.e., the need for intercoat adhesion and resistance to the effects of fluids used in the printing process. The metal component of a suitable metallic inorganic layer may be a d-block (transition) metal, an f-block (lanthanide) metal, aluminum, indium or tin, or a mixture of any of the foregoing (an alloy or, in cases in which a more definite composition exists, an intermetallic). Preferred metals include titanium, zirconium, vanadium, niobium, tantalum, molybdenum and tungsten. The non-metal component may be one or more of the p-block elements boron, carbon, nitrogen, oxygen and silicon. A metal/non-metal compound in accordance herewith may or may not have a definite stoichiometry, and may in some cases (e.g., Al—Si compounds) be an alloy. Preferred metal/non-metal combinations include TiN, TiON, $TiO_x$ (where $0.9 \leqq x \leqq 2.0$), TiC, and TiCN.

Layer 14 comprises or constitutes a material that evolves gas (e.g., $N_2$) upon rapid heating. Heat-responsive polymers that liberate nitrogen gas typically contain thermally decomposable functional groups. The polymer may itself be gas-liberating or may instead contain a decomposable material (e.g., diazonium salts or another polymer) dispersed or otherwise integrated within the polymer matrix. Thermally decomposable functional groups include azo, azide, and nitro; see, e.g., U.S. Pat. Nos. 5,308,737 and 5,278,023. The thermally decomposable groups may be incorporated into the gas-producing polymer either prior to polymerization or by modification of an existing polymer (e.g., by diazotization of an aromatic ring with sodium nitrite, or diazo transfer with tosyl azide onto an amine or β-diketone in the presence of triethylamine).

The gas-producing material may be an "energetic polymer," defined herein as a polymer containing functional groups that exothermically decompose to generate gases under pressure when rapidly heated (generally on a time scale ranging from nanoseconds to milliseconds) above a threshold temperature.

Such polymers may contain, for example, azido, nitrato, and/or nitramino functional groups. Examples of energetic polymers include poly[bis(azidomethyl)]oxetane (BAMO), glycidyl azide polymer (GAP), azidomethyl methyloxetane (AMMO), polyvinyl nitrate (PVN), nitrocellulose, acrylics, and polycarbonates.

The material of layer 14 may include a compound sensitive to (i.e., absorptive of) the imaging radiation. This allows radiation passing through layer 12 (or the remainder of the imaging pulse following ablation of layer 12) to contribute to heating of layer 14. For example, in the case of IR imaging, an IR-absorptive dye (e.g., the Kodak IR-810 dye available from Eastman Fine Chemicals, Eastman Kodak Co., Rochester, N.Y.) or pigment (e.g., the Heliogen Green L 8730 green pigment supplied by BASF Corp., Chemicals Division, Holland, Mich.) may be employed to advantage.

Imaging apparatus suitable for use in conjunction with the present printing members includes at least one laser device that emits in the region of maximum plate responsiveness, i.e., whose $lambda_{max}$ closely approximates the wavelength region where layer 12 absorbs most strongly. The device may be a diode laser or, for greater speed, a Q-switched YAG laser. Specifications for diode lasers that emit in the near-IR region are fully described in the '512 patent and in U.S. Pat. Nos. 5,385,092, 5,822,345, 4,577,932, 5,517,359, 5,802,034, 5,475,416, and 5,521,748 (the entire disclosures of which are hereby incorporated by reference); see also published European Patent Application No. 0601485. YAG lasers and lasers emitting in other regions of the electromagnetic spectrum are well-known to those skilled in the art.

The thickness of layer 14 naturally depends on the material selected. Generally, however, the thickness will be on the order of 0.5–3 μm.

Suitable imaging configurations are also set forth in detail in the '512, '092, '345 and other patents mentioned above. Briefly, laser output can be provided directly to the plate surface via lenses or other beam-guiding components, or transmitted to the surface of a blank printing plate from a remotely sited laser using a fiber-optic cable. A controller and associated positioning hardware maintains the beam output at a precise orientation with respect to the plate surface, scans the output over the surface, and activates the laser at positions adjacent selected points or areas of the plate. The controller responds to incoming image signals corresponding to the original document or picture being copied onto the plate to produce a precise negative or positive image of that original. The image signals are stored as a bitmap data file on a computer. Such files may be generated by a raster image processor (RIP) or other suitable means. For example, a RIP can accept input data in page-description language, which defines all of the features required to be transferred onto the printing plate, or as a combination of page-description language and one or more image data files. The bitmaps are constructed to define the hue of the color as well as screen frequencies and angles.

The imaging apparatus can operate on its own, functioning solely as a platemaker, or can be incorporated directly into a lithographic printing press. In the latter case, printing may commence immediately after application of the image to a blank plate, thereby reducing press set-up time considerably. The imaging apparatus can be configured as a flatbed recorder or as a drum recorder, with the lithographic plate blank mounted to the interior or exterior cylindrical surface of the drum. Obviously, the exterior drum design is more appropriate to use in situ, on a lithographic press, in which case the print cylinder itself constitutes the drum component of the recorder or plotter.

In the drum configuration, the requisite relative motion between the laser beam and the plate is achieved by rotating the drum (and the plate mounted thereon) about its axis and moving the beam parallel to the rotation axis, thereby scanning the plate circumferentially so the image "grows" in the axial direction. Alternatively, the beam can move parallel to the drum axis and, after each pass across the plate, increment angularly so that the image on the plate "grows" circumferentially. In both cases, after a complete scan by the beam, an image corresponding (positively or negatively) to the original document or picture will have been applied to the surface of the plate.

In the flatbed configuration, the beam is drawn across either axis of the plate, and is indexed along the other axis after each pass. Of course, the requisite relative motion between the beam and the plate may be produced by movement of the plate rather than (or in addition to) movement of the beam.

Regardless of the manner in which the beam is scanned, it is generally preferable (for on-press applications) to employ a plurality of lasers and guide their outputs to a single writing array. The writing array is then indexed, after completion of each pass across or along the plate, a distance determined by the number of beams emanating from the array, and by the desired resolution (i.e., the number of image points per unit length). Off-press applications, which can be designed to accommodate very rapid plate movement (e.g., through use of high-speed motors) and thereby utilize high laser pulse rates, can frequently utilize a single laser as an imaging source.

Figure 2A:
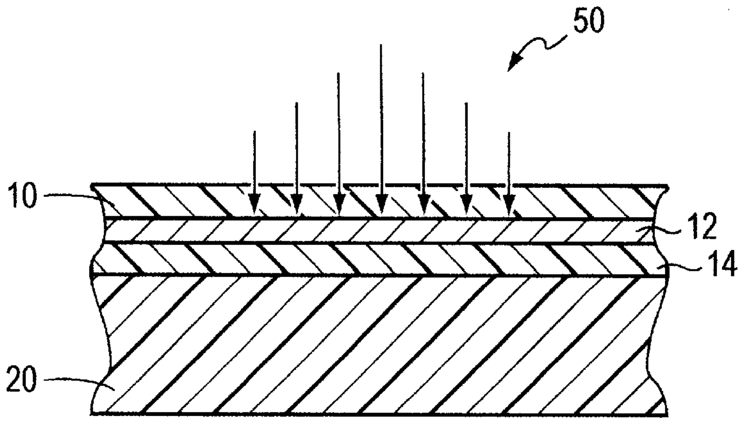
FIGS. 2A–2C illustrate the imaging process of the present invention in terms of its effects on the plate illustrated in FIG. 1.
Figure 2B:
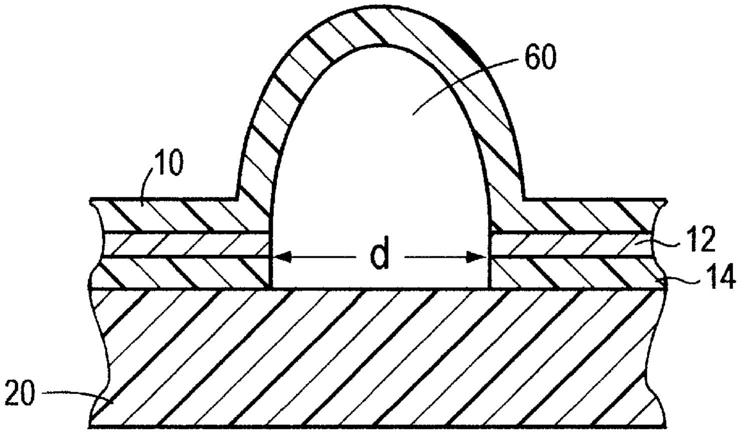
Figure 2C:
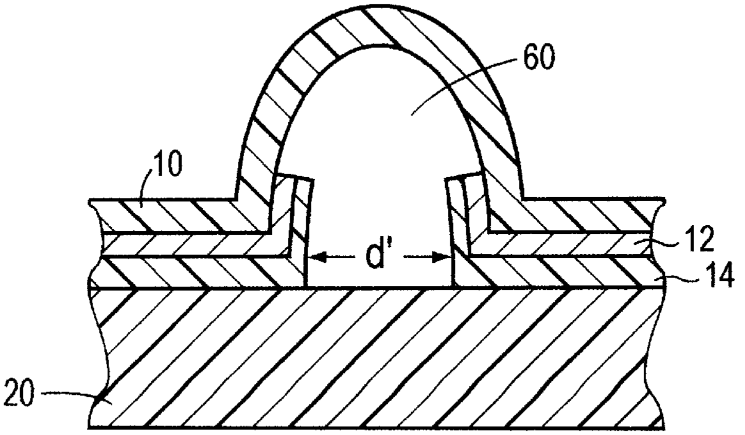

FIGS. 2A–2C illustrate the mode of operation of the present invention. Laser output is directed through layer 10; accordingly, absorptive layer 12 overlies gas-producing layer 14. YAG lasers emits "single-mode" radiation—that is, a beam having a radially symmetric Gaussian energy distribution. The bulk of the beam's energy is concentrated in a single, central peak, and falls off radially and smoothly in all directions according to the Gaussian function. A single-mode laser pulse is shown at 50, with the arrows indicating the radial energy distribution. A diode laser, by contrast, emits a "top hat" energy profile with sharp falloff occurring at the beam periphery. The invention may be practiced with virtually any laser profile, although the Gaussian YAG profile, with its centrally concentrated beam energy, contributes to the ability to image with shorter-duration pulses.

In either case, the imaging pulse strikes layer 12, causing that layer to absorb energy and effect rapid heating of underlying layer 14. Layer 14, in turn, generates gas-phase thermal decomposition products that are trapped beneath topmost layer 10. Layer 10 is elastic; as a result, a bubble 60 is formed (see FIG. 2B). The neck or base of the bubble is in the plane of substrate 10, and layers 12, 14 substantially ablate within the initial diameter d of the bubble (which matches the diameter of the incident laser beam 50).

If layer 14 releases a sufficient volume of gas under enough pressure, the neck of bubble 60 will expand beyond the exposure region d, overcoming the forces of adhesion between layer 14 and substrate 20. The affected area has a diameter d'>d, and the de-anchored portions of layers 12, 14 are removed along with the overlying layer 10 by post-image cleaning. Consequently, the resulting image spot has a diameter greater than that of the incident laser beam.

Not surprisingly, it is found experimentally that the increase in the area of the image over the area of the incident beam depends strongly on the material of layer 14. For example, with a silicone layer 10 and an acrylic polymer layer 14, application by a YAG laser of a 110 nsec laser pulse having an energy of 10 μJ creates an image spot with an area 50% larger than that obtained on constructions omitting layer 14.

Substituting a more energetic nitrocellulose layer 14, the area of the resulting image spot is observed to be more than 100% larger. Using a diode laser, a 4 μsec pulse applied to a construction having a silicone layer 10 and a nitrocellulose layer 14 creates a 50% increase in image spot size.

The effect also depends on the duration of the imaging pulse. Energy must be delivered quickly in order to create a response. Very long pulses (i.e., durations in excess of 30 μsec) fail to concentrate sufficient heat to cause any imaging effect due to heat-sinking and dispersive effects; it is for this reason that laser-imageable plates in accordance herewith do not undergo spontaneous response in ambient light. An exposure duration on the order of 10 μsec melts the metal layer 12 and causes it to recede radially, producing an image spot upon subsequent cleaning, but the image spot is actually smaller than the incident beam diameter. It is found that exposure durations on the order of 5 μsec or less create the desired effect, i.e., an image spot larger than the effective beam area. These durations can be obtained using diode laser or YAG systems, although the latter are currently capable of much shorter-duration (i.e., nsec range) pulses due to higher output power; shorter-duration pulses, even with less total energy delivered, can result in greater degrees of enlargement due to the reduced opportunity for heat dissipation.

It will therefore be seen that the foregoing represents a highly advantageous approach to laser recording, facilitating reliable imaging with reduced laser fluence requirements. The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed.

What is claimed is:

1. A method of imaging a lithographic printing member, the method comprising the steps of:

a. providing a printing member having (i) a solid substrate, (ii) first and second imaging layers over the substrate, and (iii) a topmost layer, the topmost layer and the substrate having different affinities for at least one of ink and a fluid to which ink will not adhere, the first imaging layer comprising a thermally activated gas-forming composition but not including a material absorptive of imaging radiation and the second layer comprising a material absorptive of imaging radiation, the second layer becoming sufficiently hot, upon absorption of said radiation, to cause evolution of gas from the first layer;

b. selectively exposing, in a pattern representing an image, the printing member, whereby the first and second imaging layers are destroyed and the topmost layer detached by the evolved gas in the exposed region; and c. removing remnants of the first layer where the printing member received radiation, thereby revealing the substrate to form a lithographic image.

2. The method of claim 1 wherein the exposure step comprises subjecting the printing member to a laser beam in accordance with the pattern, the laser beam having a beam diameter, each exposure to the laser beam causing destruction of the first and second layers and detachment of the topmost layer over an area larger than the beam diameter.

3. The method of claim 1 wherein the topmost layer is oleophobic and the substrate is oleophilic.

4. The method of claim 3 wherein the topmost layer is silicone.

5. The method of claim 1 wherein the topmost layer is hydrophilic and the substrate is oleophilic.

6. The method of claim 5 wherein the topmost layer is polyvinyl alcohol.

7. The method of claim 1 wherein the first layer is an energetic polymer and the second layer is a metal.

8. The method of claim 7 wherein the metal layer comprises at least one of (i) a d-block transition metal, (ii) aluminum, (iii) indium and (iv) tin.

9. The method of claim 8 wherein the metal is titanium.

10. The method of claim 7 wherein the energetic polymer comprises at least one functional group selected from azo, azide, and nitro.

11. The method of claim 7 wherein the energetic polymer is selected from the group consisting of poly[bis(azidomethyl)]oxetane, glycidyl azide polymer, azidomethyl methyloxetane, polyvinyl nitrate, nitrocellulose, acrylics, and polycarbonates.

12. The method of claim 1 wherein the first layer is an energetic polymer and the second layer comprises a metallic inorganic compound comprising a metal and a non-metal.

13. The method of claim 1 wherein the first layer overlies the substrate and the second layer overlies the first layer, the topmost layer is substantially transparent to imaging radiation, and imaging radiation is applied through the topmost layer.

14. The method of claim 13 wherein the first layer includes a material sensitive to imaging radiation.

15. The method of claim 1 wherein the first layer underlies the substrate and the second layer overlies the first layer, the substrate is substantially transparent to imaging radiation, and imaging radiation is applied through the substrate.

16. The method of claim 1 wherein the exposure step comprises subjecting the printing member to a laser beam in accordance with the pattern, the laser beam having a pulse duration no greater than 5 μsec.

17. A lithographic printing member comprising:

a. a solid substrate;

b. first and second imaging layers over the substrate; and c. a topmost layer, the topmost layer and the substrate having different affinities for at least one of ink and a fluid to which ink will not adhere, the first imaging layer comprising a thermally activated gas-forming composition but not including a material absorptive of imaging radiation and the second layer comprising a material absorptive of imaging radiation, the second layer becoming sufficiently hot, upon absorption of said radiation, to cause evolution of gas from the first layer.

18. The member of claim 17 wherein the topmost layer is oleophobic and the substrate is oleophilic.

19. The member of claim 18 wherein the topmost layer is silicone.

20. The member of claim 17 wherein the topmost layer is hydrophilic and the substrate is oleophilic.

21. The member of claim 20 wherein the topmost layer is polyvinyl alcohol.

22. The member of claim 17 wherein the first layer is an energetic polymer and the second layer is a metal.

23. The member of claim 22 wherein the metal layer comprises at least one of (i) a d-block transition metal, (ii) aluminum, (iii) indium and (iv) tin.

24. The member of claim 23 wherein the metal is titanium.

25. The member of claim 17 wherein the first layer is an energetic polymer and the second layer comprises a metallic inorganic compound comprising a metal and a non-metal.

26. The member of claim 25 wherein the energetic polymer comprises at least one functional group selected from azo, azide, and nitro.

27. The member of claim 25 wherein the energetic polymer is selected from the group consisting of poly[bis(azidomethyl)]oxetane, glycidyl azide polymer, azidomethyl methyloxetane, polyvinyl nitrate, nitrocellulose, acrylics, and polycarbonates.

28. The member of claim 17 wherein the first layer overlies the substrate and the second layer overlies the first layer.

29. The member of claim 17 wherein the first layer underlies the substrate and the second layer overlies the first layer.

* * * * *